(12) United States Patent
Douskey

(10) Patent No.: US 7,793,184 B2
(45) Date of Patent: Sep. 7, 2010

(54) LOWERING POWER CONSUMPTION DURING LOGIC BUILT-IN SELF-TESTING (LBIST) VIA CHANNEL SUPPRESSION

(75) Inventor: Steven M. Douskey, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 814 days.

(21) Appl. No.: 11/622,048

(22) Filed: Jan. 11, 2007

(65) Prior Publication Data

US 2008/0172587 A1 Jul. 17, 2008

(51) Int. Cl.
*G01R 31/28* (2006.01)

(52) U.S. Cl. .......................... 714/733; 714/25; 714/30; 714/31; 714/46; 714/709; 714/715; 714/724; 714/726; 714/727; 714/728; 714/729; 714/732; 714/734; 714/736; 714/738; 714/739; 714/742

(58) Field of Classification Search .................. None
See application file for complete search history.

(56) References Cited

U.S. PATENT DOCUMENTS

| | | | |
|---|---|---|---|
| 6,715,105 B1* | 3/2004 | Rearick | 714/30 |
| 6,745,359 B2* | 6/2004 | Nadeau-Dostie | 714/726 |
| 6,901,546 B2* | 5/2005 | Chu et al. | 714/738 |
| 6,993,694 B1* | 1/2006 | Kapur et al. | 714/733 |
| 7,028,239 B2 | 4/2006 | Jaber | |
| 7,032,148 B2* | 4/2006 | Wang et al. | 714/729 |
| 7,178,078 B2* | 2/2007 | Hiraide et al. | 714/739 |
| 2006/0156122 A1* | 7/2006 | Wang et al. | 714/726 |
| 2006/0282732 A1* | 12/2006 | Kiryu | 714/738 |
| 2007/0234150 A1* | 10/2007 | Jain et al. | 714/726 |
| 2007/0234169 A1* | 10/2007 | Rajski et al. | 714/742 |
| 2008/0294953 A1* | 11/2008 | Cheng et al. | 714/726 |
| 2009/0228749 A1* | 9/2009 | Rajski et al. | 714/726 |
| 2009/0235132 A1* | 9/2009 | Wang et al. | 714/726 |

* cited by examiner

*Primary Examiner*—John P Trimmings
(74) *Attorney, Agent, or Firm*—Dillon & Yudell, LLP; James R. Nock

(57) ABSTRACT

A method, system and computer readable medium for on-chip testing is presented. In one embodiment, the method, system or computer readable medium includes identifying which LBIST channels of a plurality of LBIST channels do not contribute to a particular test and excluding from that particular test each LBIST channel that does not contribute to that particular test.

9 Claims, 5 Drawing Sheets

| CHANNEL | CAPTURE | RELEASE |
|---------|---------|---------|
| TYPE 1  | NO      | YES     |
| TYPE 2  | YES     | YES     |
| TYPE 3  | YES     | NO      |
| TYPE 4  | NO      | NO      |

FIG. 4

LOWERING POWER CONSUMPTION DURING LOGIC BUILT-IN SELF-TESTING (LBIST) VIA CHANNEL SUPPRESSION

BACKGROUND OF THE RELATED ART

The present invention relates in general to the field of integrated circuits and similar technologies, and in particular to built-in self testing of integrated circuits and similar technologies.

Traditional methods of testing semiconductor devices are quickly becoming obsolete. The use of functional patterns derived for design verification as manufacturing test patterns is becoming increasingly unacceptable. Some of the most severe problems associated with this approach are high test development times, defect coverages that are low or hard to measure, and poor diagnosability. Therefore test techniques were developed which based analysis on the design structure rather than on functionality.

The largest problem with both the functional and design structure based test techniques is their reliance on the use of automatic test equipment (ATE) to apply the test patterns to the device's external inputs and measure responses on the device's external outputs. This approach does not provide a means to adequately detect all of the device's internal defects. Direct access to the internal structures of a device is necessary. This requirement has led to the development of design-for-test (DFT) and built-in self-test (BIST) techniques and methods.

DFT techniques consist of design rules and constraints aimed at increasing the testability of a design through increased internal controllability and observability. The most popular form of DFT is scan design, which involves modifying all internal storage elements such that in test mode they form individual stages of a shift register for scanning in test data stimuli and scanning out test responses.

Conceptually, the BIST approach is very simple. It is based on the realization that much of a circuit tester's electronics is semiconductor-based, just like the products it is testing, and that the challenge in ATE design, and many of the emerging limitations in ATE-based testing, lie in the interface to the device under test. In light of this fact, the BIST approach can be described as an attempt to move many of the already semiconductor-based test equipment functions into the products under test and eliminate the complex interfacing. This embedding of functionality has many benefits.

Logic built-in self-test (LBIST) is used for manufacturing test at all package levels and for system self-test. The basic idea in LBIST is to add a pseudorandom-pattern generator (PRPG) to the inputs and a multiple-input shift register (MISR) to the outputs of the device's internal storage elements, which are arranged to form scan chains known as LBIST channels. An LBIST controller generates all necessary waveforms for repeatedly loading pseudorandom patterns into the scan chains, initiating a functional cycle, and logging the captured responses out into the MISR. The MISR compresses the accumulated responses into a code known as a signature. Any corruption in the final signature at the end of the test indicates a defect in the chip.

System LBIST operation has historically been one of the highest power drain events in the operation of a microchip. This is primarily due to the high number of latches that are switching during the scan operations. Solutions in the past have included slowing the speed of the scans and/or staggering the scan clocks. Other solutions have included partitioning the design into LBIST islands and scanning only those islands during reduced partition tests. Drawbacks to these solutions involve longer test time—either by extending the scan time, or by requiring numerous tests that overlap tested islands to maintain coverage. This partitioning solution also requires costly extra design effort that is unique to each chip design and not repeatable from chip to chip.

SUMMARY OF THE INVENTION

To address the problems described above regarding power consumption during LBIST operation, an improved method, system and computer-readable medium is presented.

In one embodiment, the method includes identifying which LBIST channels of a plurality of LBIST channels do not contribute to a particular test and excluding from that particular test each LBIST channel that does not contribute to that particular test.

In another embodiment, the system includes at least one pseudorandom pattern generator; a plurality of LBIST channels, wherein the input of each LBIST channel is selectively coupled to the output of said at least one pseudorandom pattern generator; at least one multiple input shift register, wherein the output of each said LBIST channel is selectively coupled to said at least one multiple input shift register; and at least one channel mask, wherein said channel mask is selectively coupled to the input and output of each said LBIST channel, and wherein said channel mask is configured for excluding from a particular test each said LBIST channel of said plurality of LBIST channels that does not contribute to said particular test.

In yet another embodiment, the computer-readable medium is encoded with a computer program that, when executed, performs the steps of identifying which LBIST channels of a plurality of LBIST channels do not contribute to a particular test; and excluding from said particular test each LBIST channel of said plurality of LBIST channels that does not contribute to said particular test.

The above, as well as additional purposes, features, and advantages of the present invention will become apparent in the following detailed written description.

BRIEF DESCRIPTION OF THE DRAWINGS

The novel features believed characteristic of the invention are set forth in the appended claims. The invention itself, however, as well as a preferred mode of use, further purposes and advantages thereof, will best be understood by reference to the following detailed description of an illustrative embodiment when read in conjunction with the accompanying drawings, where:

FIG. 4 is a table showing which LBIST channel type has release data, which LBIST channel type has capture data, which LBIST channel type has both release and capture data and which LBIST channel type does not have data that is released or captured.

DETAILED DESCRIPTION OF THE PREFERRED EMBODIMENT

The present invention presents a method, system, and computer-readable medium for reducing power consumption during logical built-in self testing (LBIST) operations in integrated circuits without substantially extending scan time or requiring extra design effort that is unique to each chip design. To do so, LBIST channels that do not affect the results of a particular test are identified and LBIST channel gating is utilized to exclude those channels from the test. Previously, LBIST channels that did not affect a particular test were nonetheless included in system LBIST operation, resulting in unnecessary power drain, greater scan times, etc. A typical solution to this problem was to partition the design of the integrated circuit into LBIST islands. These LBIST islands were designed specifically for a particular integrated circuit. This increased the overall cost of the design and the added design effort could not be readily applied to different integrated circuit designs. The present invention instead uses the natural division of the channels to determine which LBIST channels to mask for each test, avoiding costly extra design effort and speeding up overall LBIST performance, while reducing power consumption. The present invention is a general solution applicable to any integrated circuit design and does not require scan clock gating or latch redistribution.

Figure 1:
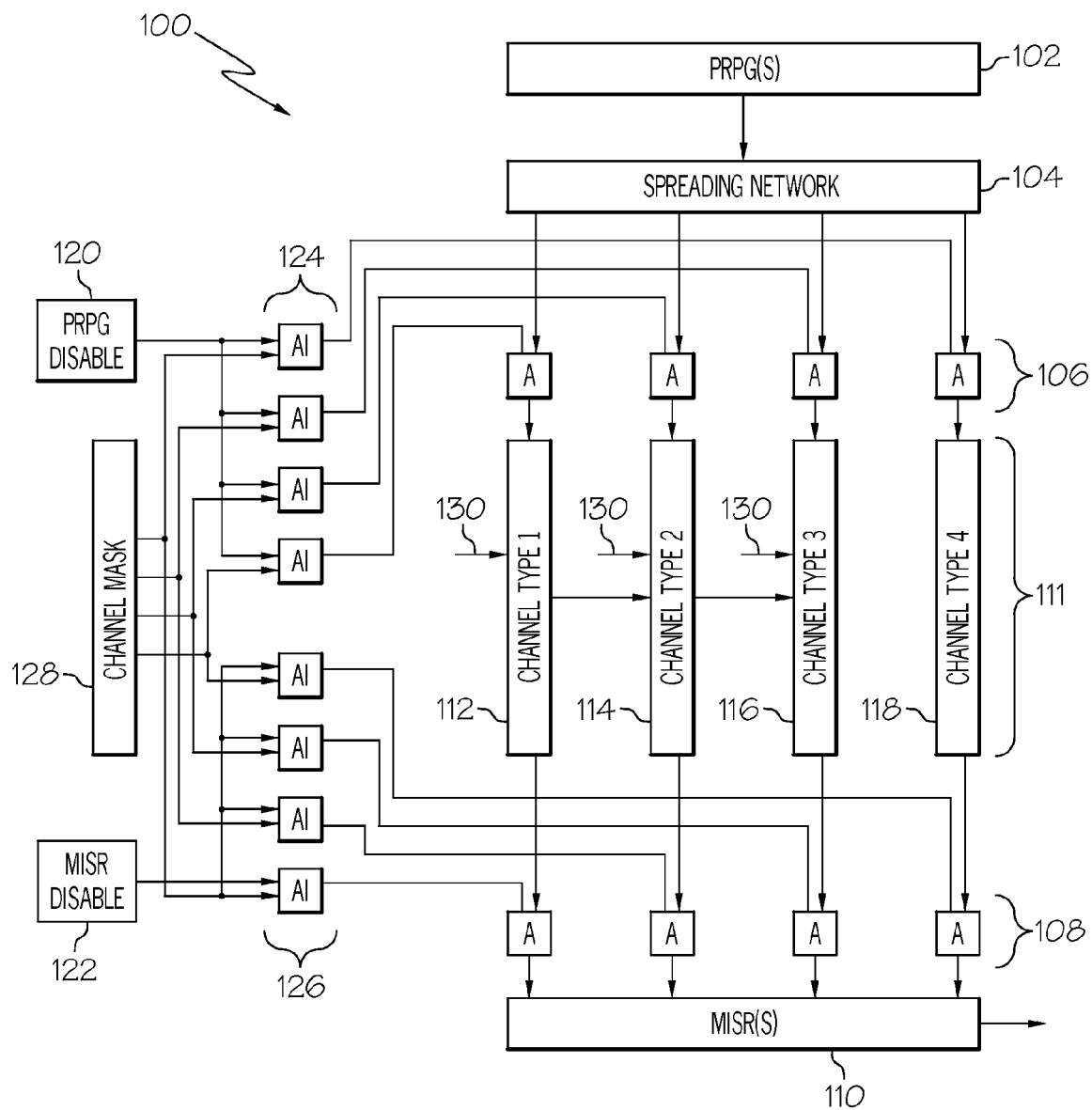
FIG. 1 is a block diagram showing exemplary logical gating that can be used to achieve this invention.

Referring now to the figures, and in particular to FIG. 1, depicted are LBIST channels 111, which for purposes of the present invention, are classified as one of four LBIST channel types. These four channel types are shown in table 400 in FIG. 4. The channel typing is based on the degree of involvement of the LBIST channel 111 in the test. Channel type 2 (114) contains latches that are clocked to capture data and latches that are clocked to release data. This makes channel type 2 (114) the most involved channel type in a test. Channel type 1 (112) contains latches that may release data, but do not capture data. Channel type 3 (116) contains latches that may capture data, but do not release data to any capture point. Channel type 4 (118) contains latches that neither release data nor capture data, and thus do not affect the results of a particular test. It is an object of the present invention to identify type 4 channels (118) and exclude these channels from LBIST operation. It should be noted that latches which neither release data nor capture data may be present in other channel types, but it is the most involved latch style in a channel that determines its channel type.

Referring again to FIG. 1, system 100 shows in minimal form the logical gating that may be used to achieve lower powered LBIST operation through channel gating in accordance with a preferred embodiment of the present invention. Components include at least one pseudorandom pattern generator (PRPG) 102 and at least one multiple input shift register (MISR) 110. In a manner described in detail below, PRPG 102 is selectively coupled to the inputs of the device's internal scan chains, and MISR 110 is selectively coupled to the outputs of the device's internal scan chains. The scan chains connecting PRPG 102 and MISR 110 are defined as LBIST channels 111. Spreading network 104 is used to distribute the output of PRPG 102 among the LBIST channels 111, minimizing any data dependencies. Logic gates 106 disposed between spreading network 104 and LBIST channels 111 are used to block PRPG 102 from releasing data to LBIST channels 111. Logic gates 108 disposed between the output of the LBIST channels 111 and the inputs of MISR 110 are used to block LBIST channels 111 from releasing data to MISR 110. It should be noted that there may be many more than the four LBIST channels 111 shown in FIG. 1. FIG. 1 merely represents each of the four channel types for the purposes of the diagram.

In typical LBIST system operation, pseudorandom patterns are loaded into LBIST channels 111, a functional cycle is initiated, and the captured responses are logged out of the LBIST channels 111 into MISR 110. MISR 110 compresses the accumulated responses into a code known as a scan signature. The scan signature obtained in the test is compared to a known-good scan signature that the functional logic should produce if operating properly. Any corruption in the scan signature at the end of the test indicates a defect in the chip. One problem with this method is that data scanned into and processed by any type 4 channel 118 has no effect on the final scan signature. This does not convey any information regarding defects and represents unnecessary power drain. It is an object of the present invention to identify type 4 channels (118) and exclude them from the system LBIST operation.

Figure 2:
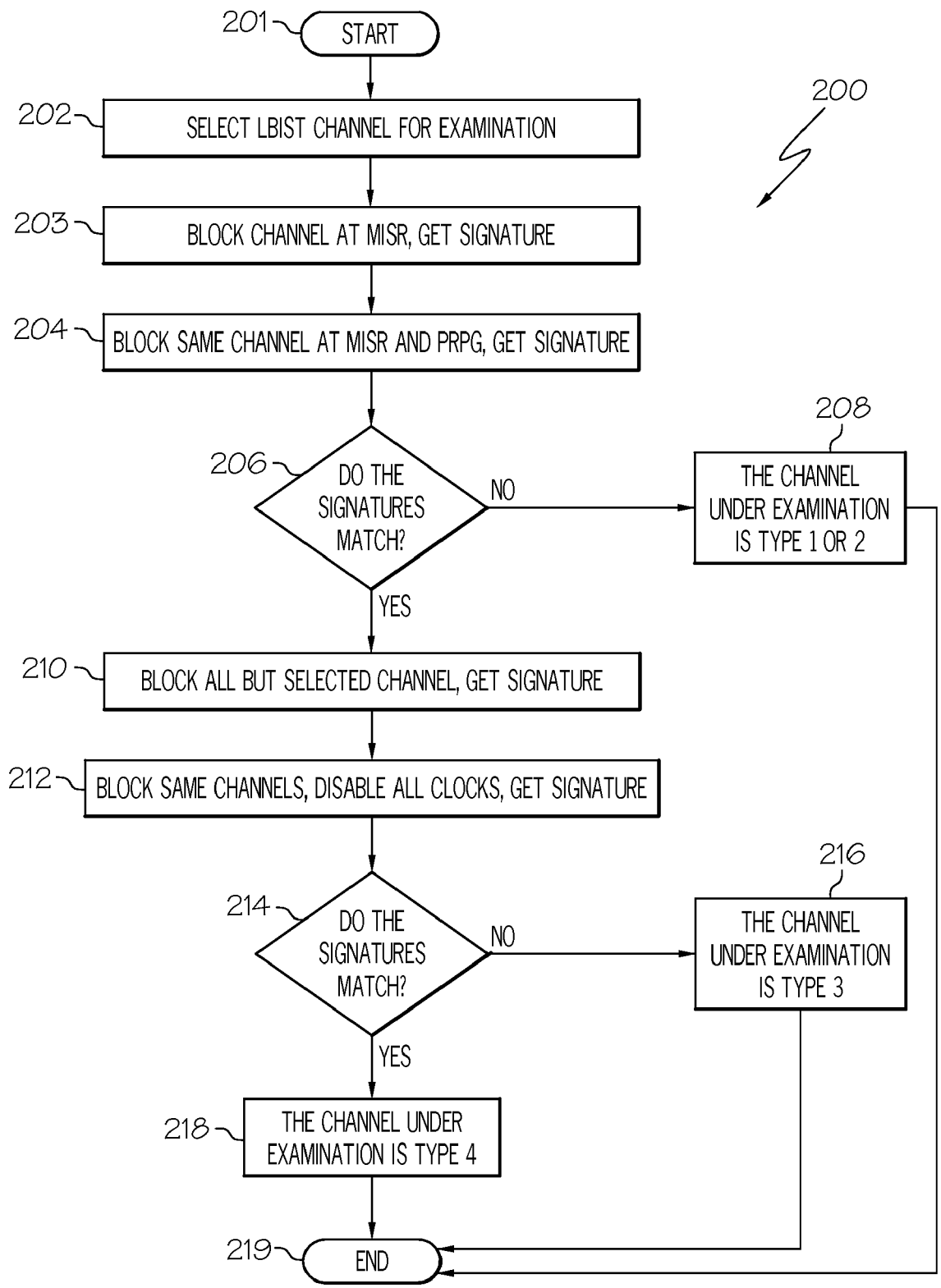
FIG. 2 is a flow chart showing steps for identifying which LBIST channels do not contribute to a particular test by first identifying which LBIST channels have release data that affect the results of a particular test, and then identifying which LBIST channels have capture data that affect the results of that test.

Referring now to FIG. 2, flowchart 200 describes the operation of system 100 depicted in FIG. 1 in accordance with a preferred embodiment of the present invention. In this embodiment, one of the LBIST channels 111 is first tested to see if it is channel type 1 (112) or channel type 2 (114), which release data. If the LBIST channel 111 under examination does not release data, then the LBIST channel 111 under examination is tested to see if it is channel type 3 (116), which captures data. If the LBIST channel 111 under examination does not capture data, then it is channel type 4 (118) and is marked for exclusion from system LBIST operations.

Referring again to FIG. 2, after initiator step 201, one LBIST channel 111 is selected for examination (step 202). As shown in step 203, this LBIST channel 111 is blocked from releasing data to MISR 110. This is accomplished by asserting MISR disable 122 and the corresponding bit in channel mask 128 for the LBIST channel 111 under examination. With these two signals asserted, the output of the corresponding NAND (AND Inverted—"AI") gate 126 is negated. This in turn causes the output of AND gate 108 to be negated, blocking the LBIST channel 111 under examination from writing to MISR 110. A first scan signature is then obtained. In step 204, the LBIST channel 111 under examination is again blocked from releasing data to MISR 110 using channel mask 128 and MISR disable 122. Additionally, PRPG 102 is blocked from releasing data into that LBIST channel 111. This is accomplished by asserting PRPG disable 120 and the corresponding bit in channel mask 128 for the LBIST channel 111 under examination. With these two signals asserted, the output of the corresponding NAND gate 124 is negated. This in turn causes the output of the specified AND gate 106 to be negated, blocking spreading network 104 from writing to the LBIST channel 111 under examination. A second scan signature is then obtained.

In step 206, the two scan signatures are compared to see if they match. With PRPG 102 blocked, the random data pattern from PRPG 102 that was scanned into the LBIST channel 111 in step 202 is not scanned into that LBIST channel 111 in step 204. Therefore, the LBIST channel 111 under examination contains different data in step 202 than in step 204. If the first and second scan signatures are different, that is a result of the LBIST channel 111 under examination releasing data that reaches an adjacent LBIST channel 111 that is not blocked from releasing data to MISR 110, since the LBIST channel 111 under examination was blocked from releasing data to MISR 110. If the two scan signatures do not match, then the LBIST channel 111 under examination is either channel type 1 (112) or channel type 2 (114), as indicated in result 208. Both channel type 1 (112) and channel type 2 (114) contain release data that affect the results and should be included in system LBIST operation. If the two scan signatures do not match, then the LBIST channel 111 under examination is either channel type 3 (116) or channel type 4 (118) and does not contain release data that affect the results. However, like a channel type 2 (114), a channel type 3 (116) contains capture data that affect the results of a scan test. Further testing is required to determine whether the LBIST channel 111 under examination is channel type 3 (116) (which captures data) or channel type 4 (118) (which does not capture data).

To determine if the LBIST channel 111 being tested is a channel type 3 (116) or a channel type 4 (118), the process continues to step 210, in which all LBIST channels 111 except for the LBIST channel 111 under examination are blocked from releasing data to MISR 110 using channel mask 128 and MISR disable 122. This is accomplished by asserting MISR disable 122 and all bits in channel mask 128 except for the LBIST channel 111 under examination. A first scan signature is obtained. In step 212, the same LBIST channels 111 are again blocked as in step 210. Additionally, all clock signals 130 are disabled. A second scan signature is then obtained with all LBIST channels 111 blocked from releasing data to MISR 110 except for the LBIST channel 111 under examination. In step 214, the two scan signatures are compared to see if they match. Since all LBIST channels 111 except for the LBIST channel 111 under examination blocked from releasing data to MISR 110, only data from the LBIST channel 111 under examination will be released to MISR 110. Therefore, if the LBIST channel 111 under examination captures data in step 210 when clock signals 130 are enabled, then the first scan signature obtained in step 210 will not match the second scan signature obtained in 212, when the clock signals 130 are disabled and no data can be captured from adjacent logic. The LBIST channel 111 under examination is channel type 3 (116), as indicated by result 216. If the first and second scan signatures match, then the LBIST channel 111 under examination does not capture data in step 210 when the clock signals 130 are enabled. The LBIST channel 111 under examination is channel type 4 (118), as indicated by result 218.

Channel type 4 (118) neither captures nor releases data that can affect the results of system LBIST operation. If the LBIST channel 111 under examination is channel type 4 (118), that LBIST channel 111 can be marked for exclusion in channel mask 128. The method outlined in flowchart 200 is repeated for each LBIST channel 111 on a clock domain. A complete channel mask for all channel type 4 (118) LBIST channels is created by setting the bits in channel mask 128 for every channel type 4 (118) that is identified by the process of flowchart 200. Channel mask 128 and PRPG disable 120 are then used to exclude all channel type 4 (118) LBIST channels from system LBIST operation.

Figure 3:
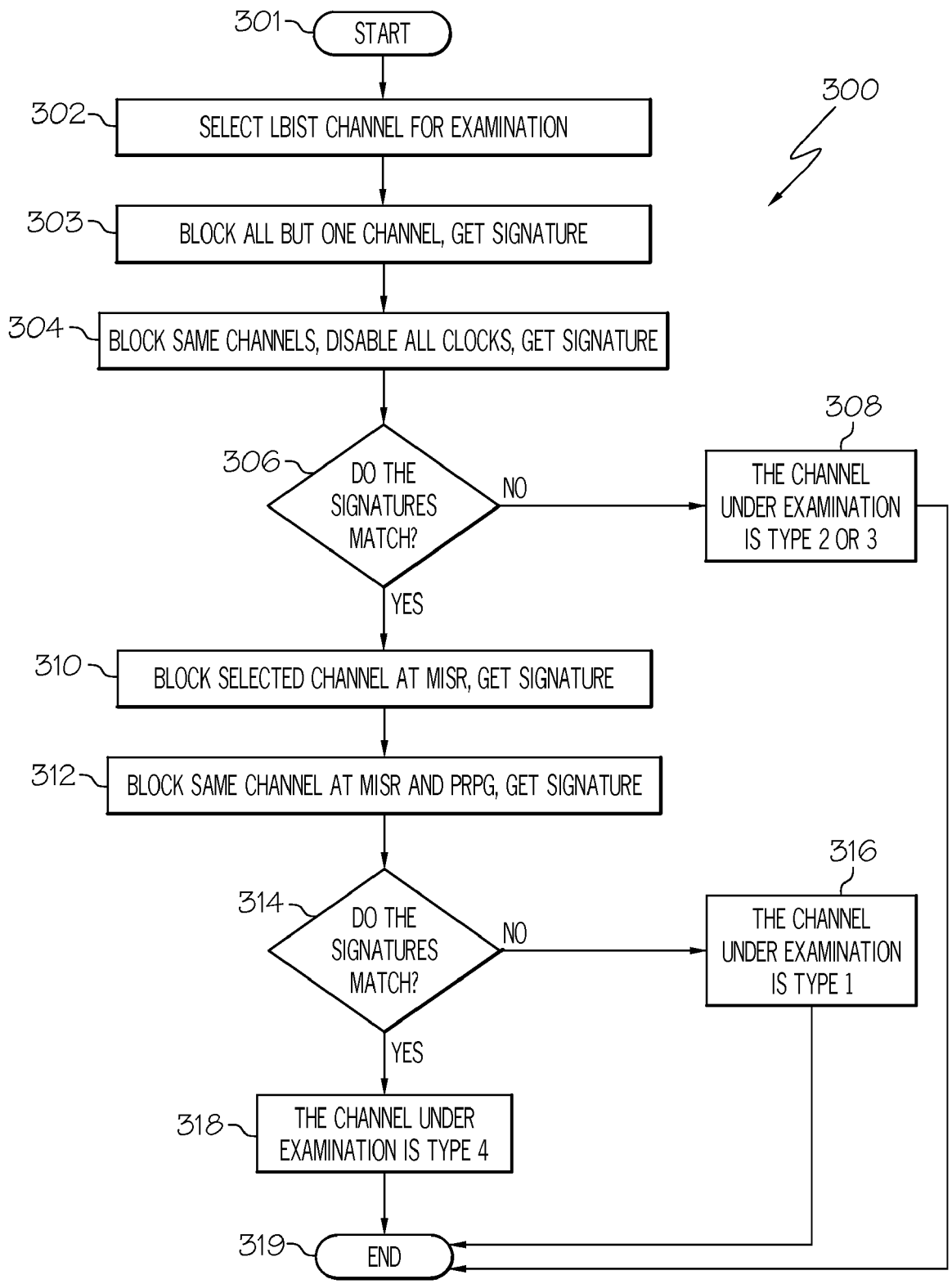
FIG. 3 is a flow chart showing steps for identifying which LBIST channels do not contribute to a particular test by first identifying which LBIST channels have capture data that affect the results of a particular test, and then identifying which LBIST channels have release data that affect the results of that test.

Another embodiment of the present invention is shown in FIG. 3. In this embodiment, the high level order is rearranged so that LBIST channel 111 is first tested to see if it is channel type 2 (114) or channel type 3 (116), which capture data. If the LBIST channel 111 under examination does not capture data, then LBIST channel 111 under examination is then tested to see if it is channel type 1 (112), which releases data. If the LBIST channel 111 under examination does not release data, then it is channel type 4 (118) and is marked for exclusion from system LBIST operations.

Referring now to FIG. 3, flowchart 300 describes the operation of system 100 depicted in FIG. 1 in accordance with an alternative embodiment of the present invention. After initiator step 301, one LBIST channel 111 is selected for examination (step 302). All LBIST channels 111 except for the LBIST channel 111 under examination are blocked from releasing data to MISR 110 using channel mask 128 and MISR disable 122 (step 303). This is accomplished by asserting MISR disable 122 and all bits in channel mask 128 except for the LBIST channel 111 under examination. A first scan signature is obtained. In step 304, the same LBIST channels 111 are again blocked as in step 302. Additionally, all clock signals 130 are disabled. A second scan signature is then obtained with all LBIST channels 111 blocked from releasing data to MISR 110 except for the LBIST channel 111 under examination.

In step 306, the two scan signatures are compared to see if they match. Since all LBIST channels 111 except for the LBIST channel 111 under examination blocked from releasing data to MISR 110, only data from the LBIST channel 111 under examination will be released to MISR 110. Therefore, if the LBIST channel 111 under examination captures data in step 302 when the clock signals 130 are enabled, then the first scan signature obtained in step 302 will not match the second scan signature obtained in 304, when the clock signals 130 are disabled and no data can be captured from adjacent logic. The LBIST channel 111 under examination is therefore either channel type 2 (114) or channel type 3 (116), as indicated by result 308. Both channel type 2 (114) or channel type 3 (116) contain capture data that affect the results and should be included in system LBIST operation. If the first and second scan signatures match, then the LBIST channel 111 under examination does not capture data in step 303 when the clock signals 130 are enabled and there is not channel type 2 (114) or channel type 3 (116). Further testing is required to determine whether the LBIST channel 111 under examination is channel type 1 (112) (which releases data) or channel type 4 (118) (which does not release data).

To determine if the LBIST channel 111 being tested is a channel type 1 (112) or a channel type 4 (118), the process continues to step 310, in which the LBIST channel 111 under examination is blocked from releasing data to MISR 110 using channel mask 128 and MISR disable 122. This is accomplished by asserting MISR disable 122 and the corresponding bit in channel mask 128 for the LBIST channel 111 under examination. A first scan signature is then obtained. In step 312, the LBIST channel 111 under examination is again blocked from releasing data to MISR 110 using channel mask 128 and MISR disable 122. Additionally, PRPG 102 is blocked from releasing data into that LBIST channel 111 using channel mask 128 and PRPG disable 120. This is accomplished by asserting PRPG disable 120 and the corresponding bit in channel mask 128 for the LBIST channel 111 under examination. A second scan signature is then obtained.

In step 314, the two scan signatures are compared to see if they match. With PRPG 102 blocked, the random data pattern from PRPG 102 that was scanned into the LBIST channel 111 in step 310 is not scanned into that LBIST channel 111 in step 312. Therefore, the LBIST channel 111 under examination contains different data in step 310 than in step 312. If the first and second scan signatures are different, that is because LBIST channel 111 under examination releases data that reaches an adjacent LBIST channel 111. The adjacent LBIST channel 111 is not blocked from releasing data to MISR 110, therefore different data is written to MISR 110 in step 310 than in step 312. If the two scan signatures do not match, then the LBIST channel 111 under examination is channel type 1

(112), as indicated in result 316. If the two scan signatures do match, then the LBIST channel 111 under examination is channel type 4 (118).

Channel type 4 (118) neither captures nor releases data that can affect the results of system LBIST operation. If the LBIST channel 111 under examination is channel type 4 (118), that LBIST channel 111 can be marked for exclusion in channel mask 128. The method outlined in flowchart 300 is repeated for each LBIST channel 111 on a clock domain. A complete channel mask for all channel type 4 (118) LBIST channels is created by setting the bits in channel mask 128 for every channel type 4 (118) that is identified by the process of flowchart 300. Channel mask 128 and PRPG disable 120 are then used to exclude all channel type 4 (118) LBIST channels from system LBIST operation.

Figure 5:
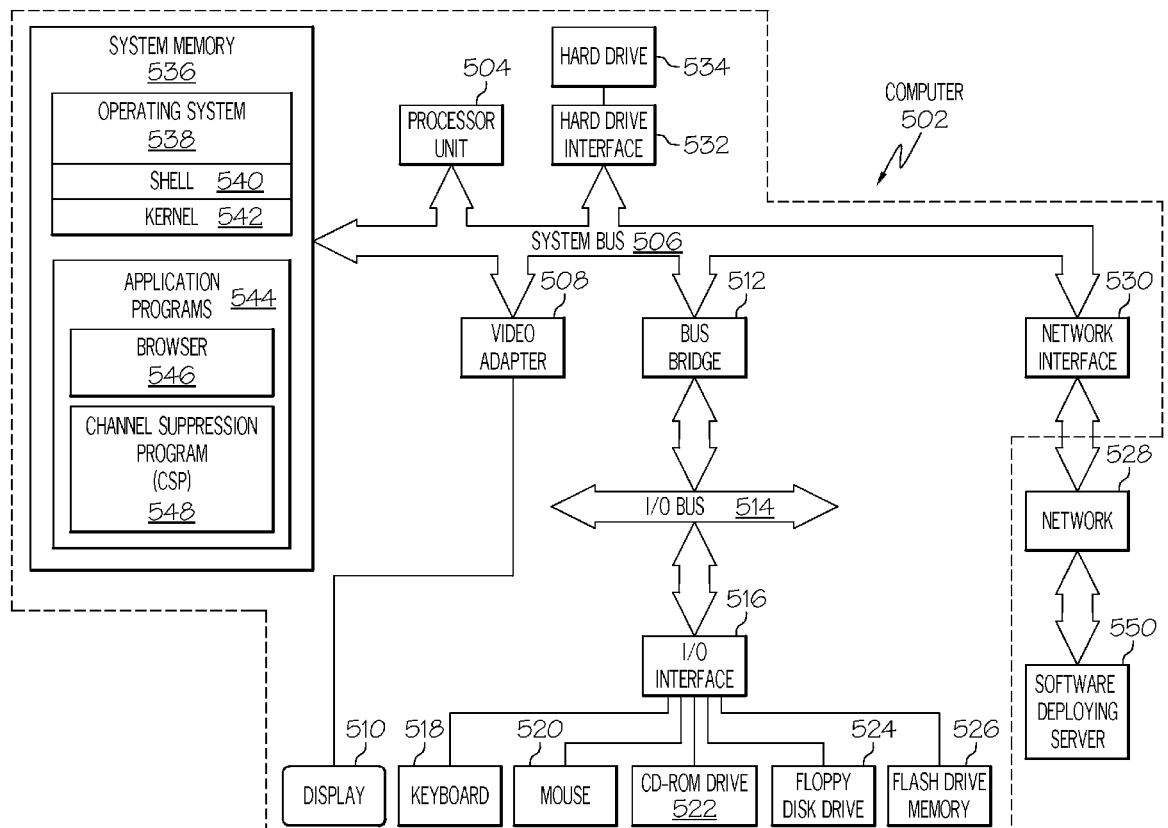
FIG. 5 depicts an exemplary computer system in which one or more embodiments of this invention may be implemented.

With reference now to FIG. 5, there is depicted a block diagram of an computer 502, which can be utilized to respectively perform and control the method and circuitry described above. Note also that some or all of the exemplary architecture shown for computer 502 may be utilized by software deploying server 550 shown in FIG. 5.

Computer 502 includes a processor unit 504 that is coupled to a system bus 506. A video adapter 508, which drives/supports a display 510, is also coupled to system bus 506. System bus 506 is coupled via a bus bridge 512 to an Input/Output (I/O) bus 514. An I/O interface 516 is coupled to I/O bus 514. I/O interface 516 affords communication with various I/O devices, including a keyboard 518, a mouse 520, a Compact Disk-Read Only Memory (CD-ROM) drive 522, a floppy disk drive 524, and a flash drive memory 526. The format of the ports connected to I/O interface 516 may be any known to those skilled in the art of computer architecture, including but not limited to Universal Serial Bus (USB) ports.

Computer 502 is able to communicate with a software deploying server 550 via a network 528 using a network interface 530, which is coupled to system bus 506. Network 528 may be an external network such as the Internet, or an internal network such as an Ethernet or a Virtual Private Network (VPN). Note the software deploying server 550 may utilize a same or substantially similar architecture as computer 502.

A hard drive interface 532 is also coupled to system bus 506. Hard drive interface 532 interfaces with a hard drive 534. In a preferred embodiment, hard drive 534 populates a system memory 536, which is also coupled to system bus 506. System memory is defined as a lowest level of volatile memory in contact center computer 502. This volatile memory includes additional higher levels of volatile memory (not shown), including, but not limited to, cache memory, registers and buffers. Data that populates system memory 536 includes computer 502's operating system (OS) 538 and application programs 544.

OS 538 includes a shell 540, for providing transparent user access to resources such as application programs 544. Generally, shell 540 is a program that provides an interpreter and an interface between the user and the operating system. More specifically, shell 540 executes commands that are entered into a command line user interface or from a file. Thus, shell 540 (as it is called in UNIX®), also called a command processor in Windows®, is generally the highest level of the operating system software hierarchy and serves as a command interpreter. The shell provides a system prompt, interprets commands entered by keyboard, mouse, or other user input media, and sends the interpreted command(s) to the appropriate lower levels of the operating system (e.g., a kernel 542) for processing. Note that while shell 540 is a text-based, line-oriented user interface, the present invention will equally well support other user interface modes, such as graphical, voice, gestural, etc.

As depicted, OS 538 also includes kernel 542, which includes lower levels of functionality for OS 538, including providing essential services required by other parts of OS 538 and application programs 544, including memory management, process and task management, disk management, and mouse and keyboard management.

Application programs 544 include a browser 546. Browser 546 includes program modules and instructions enabling a World Wide Web (WWW) client (i.e., computer 502) to send and receive network messages to the Internet using HyperText Transfer Protocol (HTTP) messaging, thus enabling communication with software deploying server 550.

Application programs 544 in computer 502's system memory (as well as software deploying server 550's system memory) also include a Channel Suppression Program (CSP) 548. CSP 548 includes code for implementing the processes described in FIGS. 2-4. In one embodiment, computer 502 is able to download CSP 548 from software deploying server 550.

The hardware elements depicted in contact center computer 502 are not intended to be exhaustive, but rather are representative to highlight essential components required by the present invention. For instance, contact center computer 502 may include alternate memory storage devices such as magnetic cassettes, Digital Versatile Disks (DVDs), Bernoulli cartridges, and the like. These and other variations are intended to be within the spirit and scope of the present invention.

Note further that, in a preferred embodiment of the present invention, software deploying server 550 performs all of the functions associated with the present invention (including execution of CSP 548), thus freeing contact center computer 502 from having to use its own internal computing resources to execute CSP 548.

Thus, it should be understood that at least some aspects of the present invention may alternatively be implemented in a program product. Programs defining functions of the present invention can be delivered to a data storage system or a computer system via a variety of signal-bearing media, which include, without limitation, non-writable storage media (e.g., CD-ROM), writable storage media (e.g., a floppy diskette, hard disk drive, read/write CD ROM, optical media), and communication media, such as computer and telephone networks including Ethernet. It should be understood, therefore in such signal-bearing media when carrying or encoding computer readable instructions that direct method functions in the present invention, represent alternative embodiments of the present invention. Further, it is understood that the present invention may be implemented by a system having means in the form of hardware, software, or a combination of software and hardware as described herein or their equivalent.

The present invention thus presents a method, system, and computer-readable medium for lowering power consumption during logical built-in self-testing via channel suppression. One embodiment of the invention includes a method for performing on-chip testing comprising the steps of identifying which LBIST channels of a plurality of LBIST channels do not contribute to a particular test and excluding each LBIST channel that does not contribute to that particular test. The step of identifying which LBIST channels do not contribute to a particular test may further comprise identifying which LBIST channels have release data that affect the results of said particular test, and identifying which LBIST channels have capture data that affect the results of said particular test.

The step of identifying which LBIST channels have release data that affect the results of that particular test may further comprise blocking at least one LBIST channel from writing data to a multiple input shift register and obtaining a first scan signature; blocking the same LBIST channel from receiving data from a pseudorandom pattern generator, blocking that LBIST channel from writing data to a multiple input shift register and obtaining a second scan signature; and comparing the first scan signature to the second scan signature to determine whether said first scan signature and said second scan signature match. The step of identifying which LBIST channels have capture data that affect the results of that particular test may further comprise blocking all but one LBIST channel from writing data to a multiple input shift register and obtaining a first scan signature; blocking the same LBIST channels from writing data to said multiple input shift register, disabling all clock signals, and obtaining a second scan signature; and comparing the first scan signature to the second scan signature to determine whether the first scan signature and the second scan signature match. The step of excluding from a particular test each LBIST channel that does not contribute to that test may further comprise using a channel mask and pseudorandom pattern generator disable to exclude each LBIST channel that does not contribute to that test.

Another embodiment of this invention includes an on-chip testing system comprising at least one pseudorandom pattern generator; a plurality of LBIST channels, wherein the input of each LBIST channel is selectively coupled to the output of a pseudorandom pattern generator; at least one multiple input shift register, wherein the output of each LBIST channel is selectively coupled to a multiple input shift register; and at least one channel mask, wherein the channel mask is selectively coupled to the input and output of each LBIST channel, and is configured for excluding from a particular test each LBIST channel that does not contribute to that test. The configuration of the channel mask may be determined by identifying which LBIST channels do not contribute to that particular test. The configuration of the channel mask may further be determined by identifying which LBIST channels have release data that affect the results and identifying which LBIST channels have capture data that affect the results. The configuration of the channel mask may be further determined by blocking at least one LBIST channel from writing data to a multiple input shift register and obtaining a first scan signature; blocking the same LBIST channel from receiving data from a pseudorandom pattern generator, blocking that LBIST channel from writing data to said multiple input shift register and obtaining a second scan signature; and comparing the first scan signature to the second scan signature to determine whether the first scan signature and the second scan signature match. The configuration of said channel mask may further be determined by blocking all but one LBIST channel of a plurality of LBIST channels from writing data to a multiple input shift register and obtaining a first scan signature; blocking the same LBIST channels from writing data to the multiple input shift register, disabling all clock signals, and obtaining a second scan signature; and comparing the first scan signature to the second scan signature to determine whether the first scan signature and the second scan signature match.

Yet another embodiment of this invention includes a computer-readable medium encoded with a computer program that, when executed, performs the steps of identifying which LBIST channels of a plurality of LBIST channels do not contribute to a particular test and excluding each LBIST channel that does not contribute to that particular test. The step of identifying which LBIST channels do not contribute to a particular test may further comprise identifying which LBIST channels have release data that affect the results of said particular test, and identifying which LBIST channels have capture data that affect the results of said particular test. The step of identifying which LBIST channels have release data that affect the results of that particular test may further comprise blocking at least one LBIST channel from writing data to a multiple input shift register and obtaining a first scan signature; blocking the same LBIST channel from receiving data from a pseudorandom pattern generator, blocking that LBIST channel from writing data to a multiple input shift register and obtaining a second scan signature; and comparing the first scan signature to the second scan signature to determine whether said first scan signature and said second scan signature match. The step of identifying which LBIST channels have capture data that affect the results of that particular test may further comprise blocking all but one LBIST channel from writing data to a multiple input shift register and obtaining a first scan signature; blocking the same LBIST channels from writing data to said multiple input shift register, disabling all clock signals, and obtaining a second scan signature; and comparing the first scan signature to the second scan signature to determine whether the first scan signature and the second scan signature match. The step of excluding from a particular test each LBIST channel that does not contribute to that test may further comprise using a channel mask and pseudorandom pattern generator disable to exclude each LBIST channel that does not contribute to that test.

While the present invention has been particularly shown and described with reference to a preferred embodiment, it will be understood by those skilled in the art that various changes in form and detail may be made therein without departing from the spirit and scope of the invention.

What is claimed is:

1. A method for performing on-chip testing comprising:
    identifying which LBIST channels of a plurality of LBIST channels do not contribute to a particular test, the step further comprising:
        identifying which LBIST channels of said plurality of LBIST channels have release data that affect the results of said particular test;
        identifying which LBIST channels of said plurality of LBIST channels have capture data that affect the results of said particular test; and
    excluding from said particular test each LBIST channel of said plurality of LBIST channels that does not contribute to said particular test.

2. The method for performing on-chip testing of claim 1, wherein the step of identifying which LBIST channels of said plurality of LBIST channels have release data that affect the results of said particular test further comprises:
    blocking at least one LBIST channel of said plurality of LBIST channels from writing data to a multiple input shift register and obtaining a first scan signature;
    blocking said at least one LBIST channel from receiving data from a pseudorandom pattern generator, blocking said at least one LBIST channel from writing data to said multiple input shift register and obtaining a second scan signature; and
    comparing said first scan signature to said second scan signature to determine whether said first scan signature and said second scan signature match.

3. The method for performing on-chip testing of claim 1, wherein the step of identifying which LBIST channels of said plurality of LBIST channels have capture data that affect the results of said particular test further comprises:

blocking all but one LBIST channel of said plurality of LBIST channels from writing data to a multiple input shift register and obtaining a first scan signature;

blocking said all but one LBIST channel of said plurality of LBIST channels from writing data to said multiple input shift register, disabling all clock signals, and obtaining a second scan signature; and comparing said first scan signature to said second scan signature to determine whether said first scan signature and said second scan signature match.

4. An on-chip testing system comprising:

at least one pseudorandom pattern generator;

a plurality of LBIST channels, wherein the input of each LBIST channel is selectively coupled to the output of said at least one pseudorandom pattern generator;

at least one multiple input shift register, wherein the output of each said LBIST channel is selectively coupled to said at least one multiple input shift register; and at least one channel mask,
  wherein said channel mask is selectively coupled to the input and output of each said LBIST channel,
  wherein said channel mask is configured for excluding from a particular test each said LBIST channel of said plurality of LBIST channels that does not contribute to said particular test, and
  wherein the configuration of said channel mask is determined by identifying which LBIST channels of said plurality of LBIST channels have release data that affect the results; and identifying which LBIST channels of said plurality of LBIST channels have capture data that affect the results.

5. An on-chip testing system comprising:

at least one pseudorandom pattern generator;

a plurality of LBIST channels, wherein the input of each LBIST channel is selectively coupled to the output of said at least one pseudorandom pattern generator;

at least one multiple input shift register, wherein the output of each said LBIST channel is selectively coupled to said at least one multiple input shift register; and at least one channel mask,
  wherein said channel mask is selectively coupled to the input and output of each said LBIST channel,
  wherein said channel mask is configured for excluding from a particular test each said LBIST channel of said plurality of LBIST channels that does not contribute to said particular test, and
  wherein the configuration of said channel mask is determined by:
    blocking at least one LBIST channel of said plurality of LBIST channels from writing data to a multiple input shift register and obtaining a first scan signature;
    blocking said at least, one LBIST channel from receiving data from a pseudorandom pattern generator, blocking said at least one LBIST channel from writing data to said multiple input shift register and obtaining a second scan signature; and
    comparing said first scan signature to said second scan signature to determine whether said first scan signature and said second scan signature match.

6. An on-chip testing system comprising:

at least one pseudorandom pattern generator;

a plurality of LBIST channels, wherein the input of each LBIST channel is selectively coupled to the output of said at least one pseudorandom pattern generator;

at least one multiple input shift register, wherein the output of each said LBIST channel is selectively coupled to said at least one multiple input shift register; and at least one channel mask,
  wherein said channel mask is selectively coupled to the input and output of each said LBIST channel,
  wherein said channel mask is configured for excluding from a particular test each said LBIST channel of said plurality of LBIST channels that does not contribute to said particular test, and
  wherein the configuration of said channel mask is determined by:
    blocking all but one LBIST channel of said plurality of LBIST channels from writing data to a multiple input shift register and obtaining a third scan signature;
    blocking said all but one LBIST channel of said plurality of LBIST channels from writing data to said multiple input shift register, disabling all clock signals, and obtaining a fourth scan signature; and
    comparing said third scan signature to said fourth scan signature to determine whether said third scan signature and said fourth scan signature match.

7. A tangible computer-readable medium encoded with a computer program that, when executed on a processor, performs the steps of:

identifying which LBIST channels of a plurality of LBIST channels do not contribute to a particular test, further comprising:
  identifying which LBIST channels of said plurality of LBIST channels have release data that affect the results of said particular test; and
  identifying which LBIST channels of said plurality of LBIST channels have capture data that affect the results of said particular test; and excluding from said particular test each LBIST channel of said plurality of LBIST channels that does not contribute to said particular test.

8. The computer-readable medium of claim 7, wherein the step of identifying which LBIST channels of said plurality of LBIST channels have release data that affect the results of said particular test further comprises:

blocking at least one LBIST channel of said plurality of LBIST channels from writing data to a multiple input shift register and obtaining a first scan signature;

blocking said at least one LBIST channel from receiving data from a pseudorandom pattern generator, blocking said at least one LBIST channel from writing data to said multiple input shift register and obtaining a second scan signature; and comparing said first scan signature to said second scan signature to determine whether said first scan signature and said second scan signature match.

9. The computer-readable medium of claim 7, wherein the step of identifying which LBIST channels of said plurality of LBIST channels have capture data that affect the results of said particular test further comprises:

blocking all but one LBIST channel of said plurality of LBIST channels from writing data to a multiple input shift register and obtaining a first scan signature;

blocking said all but one LBIST channel of said plurality of LBIST channels from writing data to said multiple input shift register, disabling all clock signals, and obtaining a second scan signature; and comparing said first scan signature to said second scan signature to determine whether said first scan signature and said second scan signature match.

* * * * *